(12) United States Patent
Chiang

(10) Patent No.: US 12,009,030 B2
(45) Date of Patent: Jun. 11, 2024

(54) CONTENT ADDRESSABLE MEMORY CELL

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 159 days.

(21) Appl. No.: 17/865,720

(22) Filed: Jul. 15, 2022

(65) Prior Publication Data

US 2023/0137324 A1    May 4, 2023

(51) Int. Cl.
*G11C 15/04* (2006.01)

(52) U.S. Cl.
CPC ................... *G11C 15/04* (2013.01)

(58) Field of Classification Search
CPC ....... G11C 15/04; G11C 15/00; G11C 15/043; G11C 15/02
See application file for complete search history.

(56) References Cited

U.S. PATENT DOCUMENTS

| | | | |
|---|---|---|---|
| 6,236,585 B1 * | 5/2001 | Hill | G11C 15/00 365/204 |
| 7,230,839 B2 | 6/2007 | Lysinger | |
| 7,450,409 B1 | 11/2008 | Maheshwari | |
| 8,848,412 B1 | 9/2014 | Yeung | |
| 9,384,836 B2 | 7/2016 | Lee | |
| 9,768,179 B1 | 9/2017 | Liaw | |
| 10,714,181 B2 | 7/2020 | Fujiwara | |
| 10,861,549 B1 | 12/2020 | Tseng | |
| 2003/0081442 A1 | 5/2003 | Tsuda | |
| 2004/0109338 A1 | 6/2004 | Jeung | |
| 2008/0285322 A1 | 11/2008 | Thummalapally | |
| 2009/0310395 A1 | 12/2009 | Chiang | |
| 2010/0067277 A1 | 3/2010 | Chiang | |

(Continued)

FOREIGN PATENT DOCUMENTS

| | | |
|---|---|---|
| CN | 109727625 A | 5/2019 |
| TW | 201519236 A | 5/2015 |

(Continued)

OTHER PUBLICATIONS

OA letter of a counterpart TW application (appl. No. 110140412) mailed on Sep. 5, 2022. Summary of the TW OA letter: Claims 1-10 are rejected as allegedly being unpatentable over cited reference 1 (TW 201519236A, also published as US20150138861A1) in view of cited reference 2 (CN 109727625A, also published as US20190130958A1).PS. Correspondence between claims of TW counterpart application and claims of US application: Claims 1-4, 5, 6-8 and 9-10 in TW counterpart application correspond to claims 1-4, 8, 5-7 and 12-13 in US application, respectively.

*Primary Examiner* — Han Yang
(74) *Attorney, Agent, or Firm* — WPAT, PC

(57) ABSTRACT

A content addressable memory cell includes storage circuits and a comparator circuit. A first storage circuit of the storage circuits is configured to store data, and a second storage circuit of the storage circuits is configured to store a state bit. The comparator circuit is configured to determine whether to adjust a level of a match line to a level of one of the data and the state bit in response to levels of search bit lines and another one of the data and the state bit.

17 Claims, 3 Drawing Sheets

(56) References Cited

U.S. PATENT DOCUMENTS

2011/0088005 A1* 4/2011 Arsovski ................ G11C 15/04
716/126
2015/0138861 A1 5/2015 Lee et al.
2019/0130958 A1 5/2019 Kim et al.

FOREIGN PATENT DOCUMENTS

| TW | I541806 | 7/2016 |
| TW | I618063 | 3/2018 |
| TW | I654609 | 3/2019 |
| TW | I692770 | 5/2020 |
| TW | 202046304 | 12/2020 |

* cited by examiner

CONTENT ADDRESSABLE MEMORY CELL

BACKGROUND OF THE INVENTION

1. Field of the Invention

The present disclosure relates to a memory device, especially to a content addressable memory cell having ternary states.

2. Description of Related Art

Content addressable memory can quickly compare stored data with data to be searched, and output the comparison result. In the existing content addressable memory, in order to achieve the "don't care" state, it is required to perform an additional compiler or encoding procedure on the previously stored data, such that the original data in the content addressable memory will be changed. As a result, the original data will not be available to the digital system, and will not be suitable for related applications that require to utilize the don't care sate and access the original data.

SUMMARY OF THE INVENTION

In some aspects of the present disclosure, a content addressable memory cell includes storage circuits and a comparison circuits. A first storage circuit in the plurality of storage circuits is configured to store data, and a second storage circuit in the plurality of storage circuits is configured to store a state bit. The comparison circuit is configured to determine whether to adjust a level of a match line to a level of one of the data and the state bit in response to levels of the plurality of search bit lines and a level of another one of the data and the state bit.

In some aspects of the present disclosure, a content addressable memory cell includes a plurality of storage circuits, a first switch, a second switch, a third switch, and a fourth switch. A first storage circuit in the plurality of storage circuits is configured to store data, and a second storage circuit in the plurality of storage circuits is configured to store a state bit. A first terminal of the first switch is coupled to a match line. A first terminal of the second switch is coupled to the match line. A first terminal of the third switch is coupled to a second terminal of the first switch, and a control terminal of the third switch is coupled to a first search bit line. A first terminal of the fourth switch is coupled to a second terminal of the second switch, and a control terminal of the fourth switch is coupled to a second search bit line. If a control terminal of the first switch receives a first data value of the data and a control terminal of the second switch receives a second data value of the data, a second terminal of the third switch and a second terminal of the fourth switch receive the state bit, or if the control terminal of the first switch and the control terminal of the second switch receive the state bit, the second terminal of the third switch receives the second data value, and the second terminal of the fourth switch receive the first data value.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
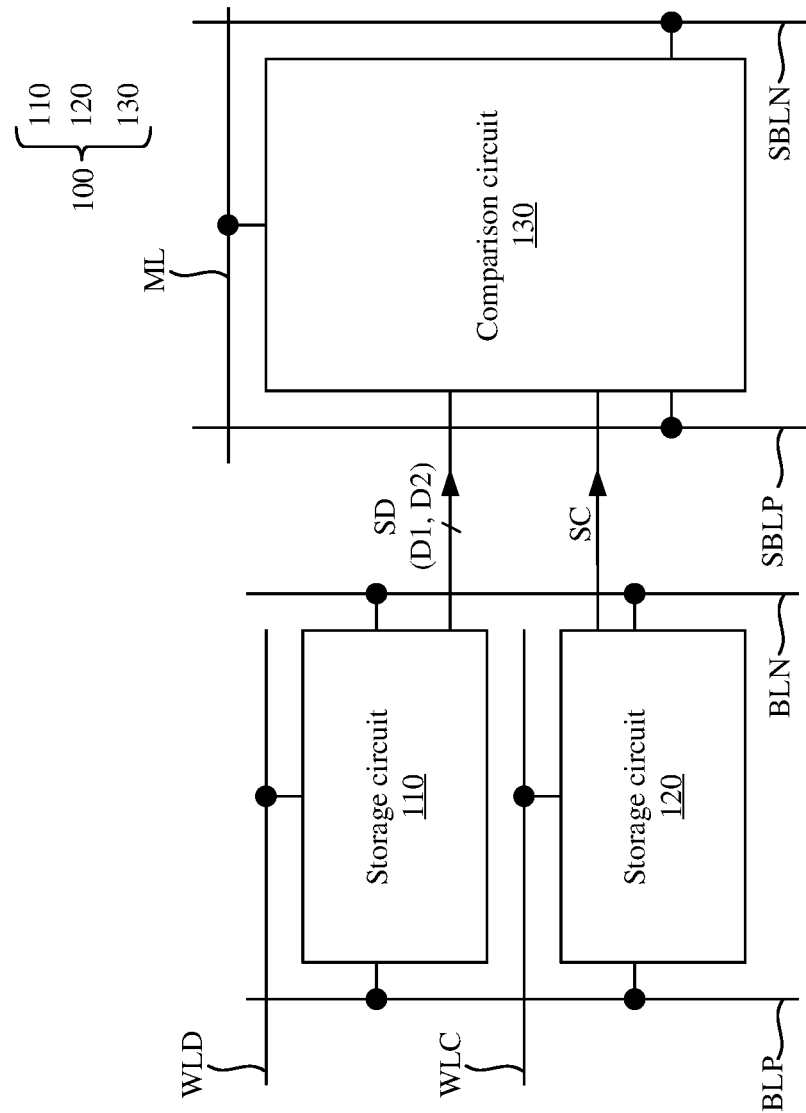
FIG. 1 illustrates a content addressable memory (CAM) cell according to some embodiments of the present disclosure.

FIG. 1 illustrates a content addressable memory (CAM) cell (hereinafter referred to as "CAM cell" for simplicity) 100 according to some embodiments of the present disclosure.

The CAM cell 100 includes a storage circuit 110, a storage circuit 120, and a comparison circuit 130. The storage circuit 110 and the storage circuit 120 are coupled to a bit line BLN and a bit line BLP. The storage circuit 110 is configured to store data SD. The data SD may be expressed with a data value D1 and a data value D2. For example, if the data value D1 has a logic value of 1 and the data value D2 has a logic value of 0, it indicates that the data SD is a bit having a first steady state (e.g., bit 1). Alternatively, if the data value D1 has the logic value of and the data value D2 has the logic value of 1, it indicates that the data SD is a bit having a second steady state (e.g., bit 0), but the present disclosure is not limited thereto.

The storage circuit 120 is configured to store a state bit SC. The state bit SC may be configured to indicate an operating state of the CAM cell 100. For example, when the state bit SC has a predetermined logic value (e.g., a logic value of 1), the CAM cell 100 operates in a "don't care" state. Under this condition, the comparison circuit 130 does not adjust the level of the match line ML (i.e., keep the level of the match line ML unchanged). Alternatively, when the state bit SC has a logic value different from the predetermined logic value (e.g., a logic value of 0), the CAM cell 100 operates in a "care" state. Under this condition, the comparison circuit 130 may determine whether to adjust the level of the match line ML according to a comparison result of data to be searched and the data SD, in order to indicate whether the data to be searched and the data SD are the same. In other words, the CAM cell 100 is a ternary CAM cell, which may present the first steady state, the second steady state, and the don't care state.

The comparison circuit 130 is configured to, in response to levels of search bit lines SBLP and SBLN and one of the data SD and the state bit SC, determine whether to adjust the level of the match line ML to a level of another one of the data SD and the state bit SC. In examples of FIG. 2, the comparison circuit 130 determines whether to adjust the level of the match line ML to the level of the state bit SC in response to the data SD and the levels of the search bit lines SBLP and SBLN. Alternatively, in examples of FIG. 3, the comparison circuit 130 determines whether to adjust the level of the match line ML to the level of the data value D1 or that of the data value D2 in response to the state bit SC and the levels of the search bit lines SBLP and SBLN.

The levels of the search bit lines SBLP and SBLN may be configured to indicate the data to be searched. For example, if the search bit line SBLP has a logical high level and the search bit line SBLN has a logical low level, it indicates that the data to be searched is a bit 1. Alternatively, if the search bit line SBLP has the logical low level and the search bit line SBLN has the logical high level, it indicates that the data to be searched is a bit 0, but the present disclosure is not limited thereto.

In some embodiments, the comparison circuit 130 may operate as a XOR gate circuit, in order to determine whether the data SD and the data to be searched are the same. Before starting to search data, the level of the match line ML is pre-charged to a high level. If the CAM cell 100 operates in the care state and the data SD is the same as the data to be searched, the comparison circuit 130 may not adjust the level of the match line ML (i.e., keep the level of the match line ML being at the high level), in order to indicate that the comparison result is a match. Alternatively, if the CAM cell 100 operates in the care state and the data SD is different from the data to be searched, the comparison circuit 130 adjusts the level of the match line ML to a low level, in order to indicate that the comparison result is a mismatch. Detailed operations and arrangements regarding herein will be described with reference to FIG. 2 and FIG. 3.

Figure 2:
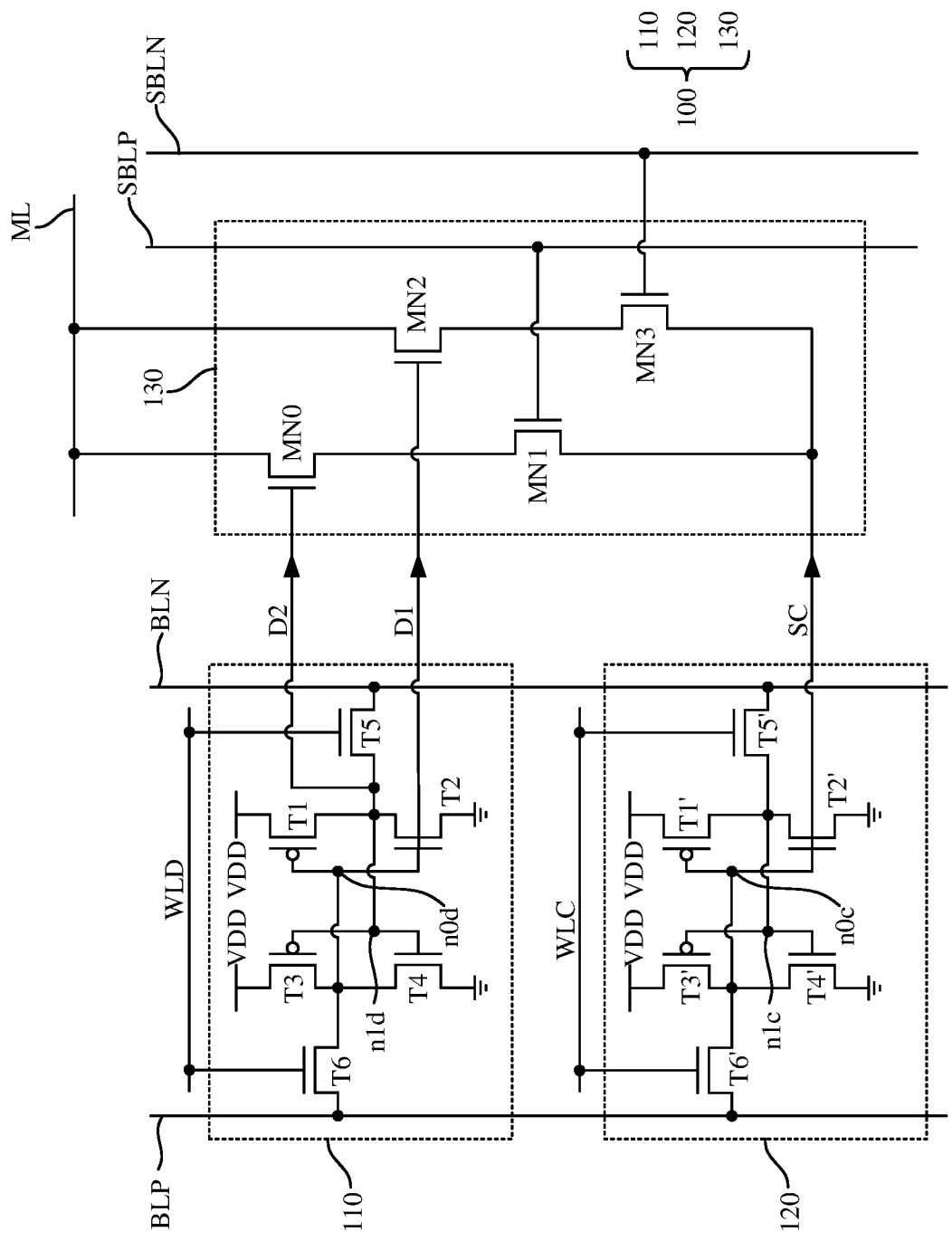
FIG. 2 illustrates a circuit diagram of the CAM cell in FIG. 1 according to some embodiments of the present disclosure.

FIG. 2 illustrates a circuit diagram of the CAM cell 100 in FIG. 1 according to some embodiments of the present disclosure. In this example, each of the storage circuit 110 and the storage circuit 120 may be a bit cell implemented with six transistors. In greater detail, the storage circuit 110 includes transistors T1-T6. A first terminal of the transistor T1 (e.g., source/drain) receives a voltage VDD, a second terminal of the transistor T1 (e.g., drain/source) is coupled to a first terminal of the transistor T2, and a second terminal of the transistor T2 is coupled to ground. The first terminal of the transistor T3 receives the voltage VDD, A second terminal of the transistor T3 is coupled to a first terminal of the transistor T4, and a second terminal of the transistor T4 is coupled to ground. A control terminal of the transistor T1 (e.g., gate), a control terminal of the transistor T2, a second terminal of the transistor T3 and the first terminal of the transistor T4 are coupled to a node n0d, and are configured to generate the data value DE A control terminal of the transistor T3, a control terminal of the transistor T4, the second terminal of the transistor T1, and the first terminal of the transistor T2 are coupled to a node n1d, and are configured to generate the data value D2.

With the above arrangement, the transistor T1 and the transistor T2 may form a first inverter circuit, the transistor T3 and the transistor T4 may form a second inverter circuit, and the first inverter circuit and the second inverter circuit may be cross-coupled to form a latch circuit. For example, an output terminal of the first inverter circuit (i.e., the node n1d) is coupled to an input terminal of the second inverter circuit (i.e., gates of the transistors T3-T4), and an output terminal of the second inverter circuit (i.e., the node n0d) is coupled to the input terminal of the first inverter circuit (e.g., gates of the transistors T1-T2). In other words, the data value D1 and the data value D2 are outputs of the latch circuit in the storage circuit 110, and the data value D1 and the data value D2 have the opposite logic values. For example, if the data value D1 has the logic value of 0, the data value D2 has the logic value of 1. Alternatively, the data value D1 has the logic value of 1, the data value D2 has the logic value of 0.

A first terminal of the transistor T5 is coupled to a node n1d, a second terminal of the transistor T5 is coupled to the bit line BLN, and a control terminal of the transistor T5 is coupled to a word line WLD. A first terminal of the transistor T6 is coupled to the bit line BLP, a second terminal of the transistor T6 is coupled to the node n0d, and the control terminal of the transistor T6 is coupled to the word line WLD. In response to the level of the word line WLD, the transistors T5-T6 may be selectively turned on, in order to adjust the level of the bit line BLN according to the level of the node n1d (e.g., the level of the data value D2), and adjust the level of the bit line BLP according to the node of the node n0d (e.g., the level of the data value D1).

The storage circuit 120 includes transistors T1'-T6'. A node n0c and a node n1c in the storage circuit 210 respectively correspond to the node n0d and the node n1d in the storage circuit 110. The arrangements among the transistors T1'-T6', the word line WLC, the bit line BLN, and the bit line BLP are similar to those among the transistors T1-T6, the word line WLD, the bit line BLN, and the bit line BLP in the storage circuit 120, and thus the repetitious descriptions are not further given. Similar to the storage circuit 110, the state bit SC is an output of the latch circuit in the storage circuit 120 (in this example, it is a signal outputted from the node n0c).

In this example, the comparison circuit 130 may determine whether to adjust the level of the match line ML to the level of the state bit SC in response to the data SD (i.e., the data value D1 and the data value D2) and the levels of the search bit lines SBLN and SBLP. In greater detail, the comparison circuit 130 includes switches MN0-MN3. A first terminal of the switch MN0 is coupled to the match line ML, a second terminal of the switch MN0 is coupled to a first terminal of the switch MN1, and a control terminal of the switch MN0 receives the data value D2. The switch MN0 is configured to be selectively turned on according to the data value D2. A second terminal of the switch MN1 receives the state bit SC, and a control terminal of the switch MN1 is coupled to the search bit line SBLP. The switch MN1 is configured to be selectively turned on in response to the level of the search bit line SBLP, in order to transmit the state bit SC to the switch MN0. A first terminal of the switch MN2 is coupled to the match line ML, a second terminal of the switch MN2 is coupled to a first terminal of the switch MN3, and a control terminal of the switch MN2 receives the data value D1. The switch MN2 is configured to be selectively turned on according to the data value D1. A second terminal of the switch MN3 receives the state bit SC, and the control terminal of the switch MN3 is coupled to the search bit line SBLN. The switch MN3 is configured to be selectively turned in response to the level of the search bit line SBLN, in order to transmit the state bit SC to the switch MN2.

In this example, a truth table of the CAM cell 100 is as follows:

| Operating state/data SD | SC (node n0c) | D1 | D2 | SBLP | SBLN | ML | Comparison result |
|---|---|---|---|---|---|---|---|
| don't care/bit 1 | 1 | 1 | 0 | 1 | 0 | 1 | Match |
| don't care/bit 0 | 1 | 0 | 1 | 0 | 1 | 1 | Match |
| care/bit 1 | 0 | 1 | 0 | 1 | 0 | 1 | Match |
| care/bit 1 | 0 | 1 | 0 | 0 | 1 | 0 | Mismatch |
| care/bit 0 | 0 | 0 | 1 | 1 | 0 | 0 | Mismatch |
| care/bit 0 | 0 | 0 | 1 | 0 | 1 | 1 | Match |

As mentioned above, when the state bit SC has the predetermined logic value (e.g., the logic value of 1), the CAM cell 100 operates in the don't care state. As the state bit SC has the logic value of 1, the level corresponding the logic value of 1 is the same as the level of the match line ML after being pre-charged (which is labeled with 1 in the above table). Under this condition, no matter the data SD (or the data to be searched) is bit 1 or bit 0, the match line ML is not discharged via the switches MN0-MN3, and thus the level of the match line ML is not adjusted. Therefore, the level of the match line ML is kept unchanged.

When the state bit SC has another logic value (e.g., the logic value of 0) that is opposite to the predetermined logic value, the CAM cell 100 operates in the care state. Under this condition, if the data SD is bit 1 (i.e., the data value D1 has the logic value of 1 and the data value D2 has the logic value of 0) and the data to be searched is bit 1 (i.e., the search bit line SBLP is at a high level (labeled as 1) and the search bit line SBLN is at a low level (labeled as 0), the switches MN0 and MN3 are not turned on, such that the match line ML is not discharged by the comparison circuit 130. As a result, the level of the match line ML is kept unchanged to indicate that the comparison result is match (i.e., the data SD is the same as the data to be searched). Alternatively, if the data SD is bit 1 and the data to be searched is bit 0 (i.e., the search bit line SBLP is at the low level and the search bit line SBLN is at the high level), the switches MN0-MN1 are not turned on and the switches MN2-MN3 are turned on, such that the comparison circuit 130 may pull down the level of the match line ML to the level of the state bit SC. In other words, under this condition, the match line ML may be discharged via the switches MN2-MN3. As a result, the level of the match line ML may be adjusted to the low level corresponding to the logic value of 0, in order to indicate that the comparison result is a mismatch (i.e., the data SD is different from the data to be searched).

Similarly, under the condition that the CAM cell 100 operates in the care state, if the data SD is bit 0 (i.e., the data value D1 is the logic value of 0 and the data value D2 is the logic value 1) and the data to be searched is bit 1 (i.e., the search bit line SBLP is at the high level and the search bit line SBLN is at the low level), the switches MN2 and MN3 are not turned on and the switches MN0-MN1 are turned, such that the comparison circuit 130 may pull down the level of the match line ML to the corresponding level of the state bit SC. In other words, under this condition, the match line ML may be discharged via the switches MN0 and MN1. As a result, the level of the match line ML may be adjusted to the low level corresponding to the logic value of 0, in order to indicate that the comparison result is a mismatch (i.e., the data SD is different from the data to be searched). Alternatively, if the data SD is bit 0 and the data to be searched is bit 0 (i.e., the search bit line SBLP is at the low level and the search bit line SBLN is at the high level), the switches MN0 and MN3 are turned on and the switches MN1 and MN2 are not turned on, such that the match line ML is not discharged by the comparison circuit 130. As a result, the level of the match line ML is kept at the high level to indicate the comparison result is a match.

Figure 3:
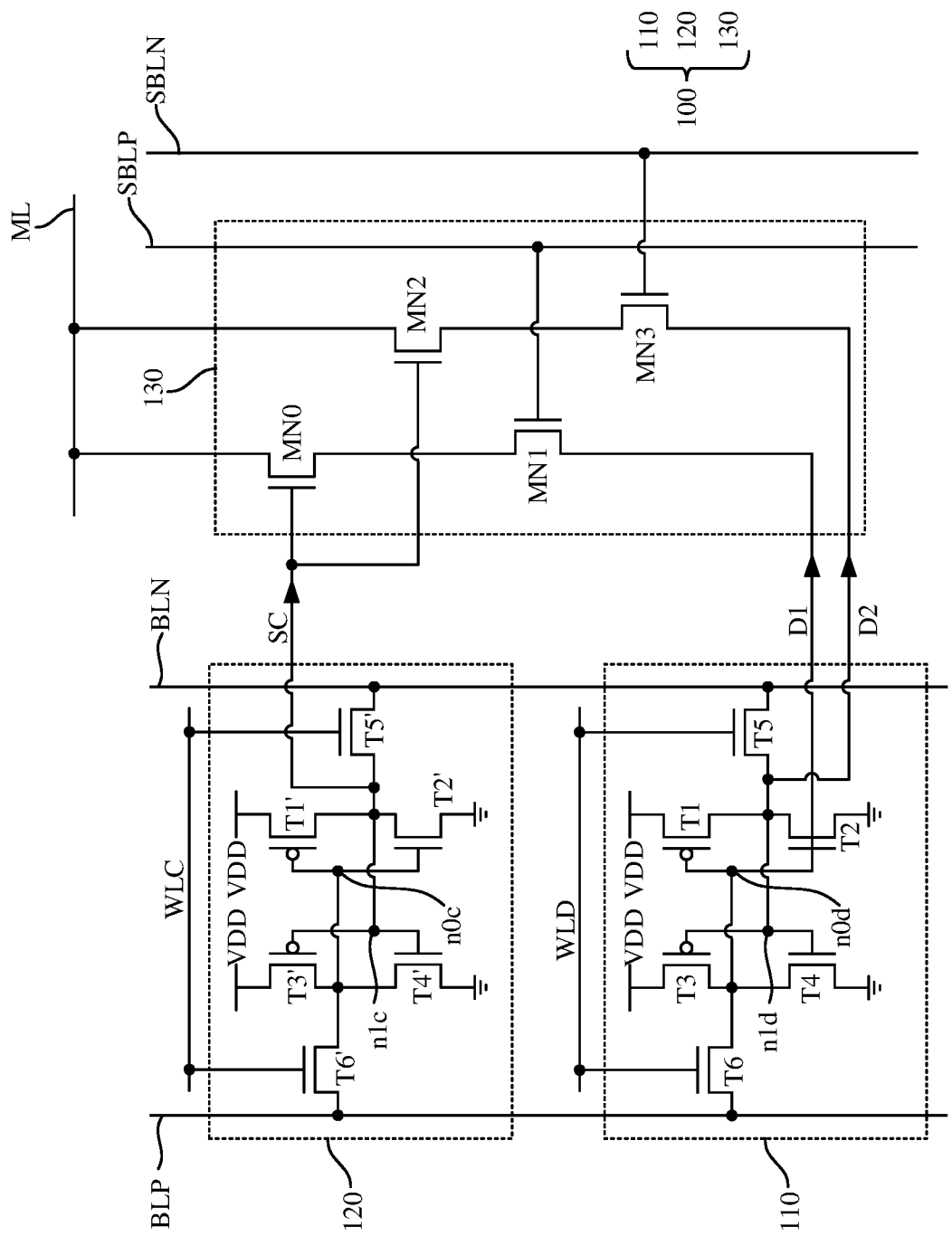
FIG. 3 illustrates a circuit diagram of the CAM cell in FIG. 1 according to some embodiments of the present disclosure.

FIG. 3 illustrates a circuit diagram of the CAM cell 100 in FIG. 1 according to some embodiments of the present disclosure. Compared with FIG. 2, in this example, the comparison circuit 130 determines whether to adjust the level of the match line ML to the level of the data SD (i.e., the data value D1 and the data value D2) in response to the state bit SC and the levels of the search bit lines SBLN and SBLP. The connections among the switches MN0-MN3 and the storage circuits 110 and 120 in FIG. 3 are different from those in FIG. 2.

Different from FIG. 2, In this example, the state bit SC is another output of the latch circuit included in the storage circuit 120 (in this example, it is the signal outputted from the node n1c). It is understood that, the signal outputted from the node n1c and the signal outputted from the node n0c have opposite logic values. Accordingly, in this example, when the state bit SC has the logic value of 0 (which equals to the predetermined logic value in this example), the CAM cell 100 operates in the don't care state. Alternatively, when the state bit SC has the logic value of 1, the CAM cell 100 operates in the care state.

In greater detail, as shown in FIG. 2, if the control terminal of the switch MN0 receives the data value D2 and the control terminal of the switch MN1 receives the data value D1, the second terminals of the switches MN1 and MN3 receive the state bit SC. Different from FIG. 2, as shown in FIG. 3, if the control terminals of the switches MN0 and MN2 receive the state bit SC, the second terminal of the switch MN1 is adjusted to receive the data value D1, and the second terminal of the switch MN3 is adjusted to receive the data value D2. In other words, in examples of FIG. 3, the switches MN0 and MN2 may be selectively turned on according to the state bit SC, the switch MN1 may selectively transmit the data value D1 to the switch MN0, and the switch MN3 may selectively transmit the data value D2 to the switch MN2.

In this example, the truth table of the CAM cell 100 is as follows:

| operating state/data SD | SC (node n1c) | D1 | D2 | SBLP | SBLN | ML | comparison result |
|---|---|---|---|---|---|---|---|
| don't care/bit 1 | 0 | 1 | 0 | 1 | 0 | 1 | Match |
| don't care/bit 0 | 0 | 0 | 1 | 0 | 1 | 1 | Match |
| care/bit 1 | 1 | 1 | 0 | 1 | 0 | 1 | Match |
| care/bit 1 | 1 | 1 | 0 | 0 | 1 | 0 | Mismatch |
| care/bit 0 | 1 | 0 | 1 | 1 | 0 | 0 | Mismatch |
| care/bit 0 | 1 | 0 | 1 | 0 | 1 | 1 | Match |

When the state bit SC is the logic value of 0, the CAM cell 100 operates in the don't care state. In response to the state bit SC, the switch MN0 and the switch MN2 are not turned on. Under this condition, no matter the data SD (or the data to be searched) is bit 1 or bit 0, the match line ML is not discharged by the comparison circuit 130, and the level of the match line ML is not adjusted. Therefore, the level of the match line ML is kept unchanged.

When the state bit SC has the logic value of 1, the CAM cell 100 operates in the care state. Under this condition, if the data SD is bit 1 (i.e., the data value D1 is the logic value of 1 and the data value D2 is the logic value of 0) and the data to be searched is bit 1 (i.e., the search bit line SBLP is at the high level and the search bit line SBLN is at the low level), the switches MN0, MN1, and MN2 are turned on and the switch MN3 is not turned on. As the data value D1 has the high level corresponding to the logic value of 1, the match line ML is not discharged via the switches MN0 and MN1. As a result, the level of the match line ML is kept unchanged to indicate that the comparison result is a match. Alternatively, if the data SD is bit 1 and the data to be searched is bit 1 (i.e., search bit line SBLP is at the low level and the search bit line SBLN is at the high level), the switches MN0, MN2, and MN3 are turned on and the switch MN1 is not turned on. As the data value D2 has the low level corresponding to the logic value of 0, the match line ML may be discharged via the switches MN2 and MN3. In other words, the switches MN2 and MN3 may pull down the level of the match line ML to the level of the data value D2. As a result, the level of the match line ML is adjusted to the low level corresponding to the logic value of 0, in order to indicate that the comparison result is a mismatch.

Similarly, when the state bit SC has the logic value of 1, the CAM cell 100 operates in the care state. Under this condition, if the data SD is bit 0 (i.e., the data value D1 is the logic value of 0 and the data value D2 is the logic value of 1) and the data to be searched is bit 1 (i.e., the search bit line SBLP is at the high level and the search bit line SBLN is at the low level), the switches MN0, MN1, and MN2 are turned on and the switch MN3 is not turned on. As the data value D1 has the low level corresponding to the logic value of 0, the match line ML may be discharged via the switches MN0 and MN1. In other words, the switches MN0 and MN1 may pull down the level of the match line ML to the level of the data value D1. As a result, the level of the match line ML is adjusted to the low level corresponding to the logic value of 0, in order to indicate that the comparison result is a mismatch. Alternatively, if the data SD is bit 0 and the data to be searched is bit 0 (i.e., the search bit line SBLP is at the low level and the search bit line SBLN is at the high level), the switches MN0, MN2, and MN3 are turned on and the switch MN1 is not turned on. As the data value D2 has the high level corresponding to the logic value of 1, the match line ML is not discharged via the switches MN2 and MN3. As a result, the level of the match line ML is kept unchanged to indicate that the comparison result is a match.

Based on FIG. 2 and FIG. 3, in some embodiments, the CAM cell 100 may utilize the existing circuit operations to implement the don't care state. In other words, the CAM cell 100 may operate in the don't care state without employing additional compiler or encoding mechanism. The data stored in the CAM cell 100 is prevented from being changed. Moreover, the number of transistors in the CAM cell 100 is the same as that in a general CAM cell, and thus the circuit area is not significantly increased.

In the above embodiments, the switches MN0-MN3 may be implemented with N-type transistors, but the present disclosure is not limited thereto. In other embodiments, according to practical requirements, the switches MN0-MN3 may be implemented with P-type transistors or a combination of P type transistor(s) and N type transistor(s).

As described above, the CAM cell provided in some embodiments of the present disclosure may implement the don't care state without employing additional compiler or encoding procedure. As a result, the data stored in the CAM cell can be kept.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A content addressable memory cell, comprising:
   a plurality of storage circuits, wherein a first storage circuit in the plurality of storage circuits is configured to store data, and a second storage circuit in the plurality of storage circuits is configured to store a state bit; and
   a comparison circuit configured to determine whether to adjust a level of a match line to a level of one of the data and the state bit in response to levels of the plurality of search bit lines and a level of another one of the data and the state bit.

2. The content addressable memory cell of claim 1, wherein when the state bit is a predetermined logic value, the comparison circuit does not adjust the level of the match line.

3. The content addressable memory cell of claim 1, wherein when the state bit is a predetermined logic value, the content addressable memory cell operates in a don't care state.

4. The content addressable memory cell of claim 1, wherein the comparison circuit comprises:
   a first switch configured to be selectively turned on according to a first data value of the data;
   a second switch configured to be selectively turned on according to a second data value of the data;
   a third switch configured to be selectively turned on according to a level of a first search bit line in the plurality of search bit lines, in order to transmit the state bit to the first switch; and
   a fourth switch configured to be selectively turned on according to a level of a second search bit line in the plurality of search bit lines, in order to transmit the state bit to the second switch.

5. The content addressable memory cell of claim 4, wherein the first storage circuit comprises a latch circuit, and the first data value and the second data value are a plurality of outputs of the latch circuit.

6. The content addressable memory cell of claim 4, wherein the first data value and the second data value have opposite logic values.

7. The content addressable memory cell of claim 4, wherein the second storage circuit comprises a latch circuit, and the state bit is an output of the latch circuit.

8. The content addressable memory cell of claim 1, wherein the comparison circuit comprises:
- a first switch configured to be selectively turned on according to the state bit;
- a second switch configured to be selectively turned on according to the state bit;
- a third switch configured to be selectively turned on according to a level of a first search bit line in the plurality of search bit lines, in order to transmit a first data value of the data to the first switch; and
- a fourth switch configured to be selectively turned on according to a level of a second search bit line in the plurality of search bit lines, in order to transmit a second data value of the data to the second switch.

9. The content addressable memory cell of claim 8, wherein the first storage circuit comprises a latch circuit, and the first data value and the second data value are a plurality of outputs of the latch circuit.

10. The content addressable memory cell of claim 8, wherein the first data value and the second data value have opposite logic values.

11. The content addressable memory cell of claim 8, wherein the second storage circuit comprises a latch circuit, and the state bit is an output of the latch circuit.

12. A content addressable memory cell, comprising:
- a plurality of storage circuits, wherein a first storage circuit in the plurality of storage circuits is configured to store data, and a second storage circuit in the plurality of storage circuits is configured to store a state bit;
- a first switch, wherein a first terminal of the first switch is coupled to a match line;
- a second switch, wherein a first terminal of the second switch is coupled to the match line;
- a third switch, wherein a first terminal of the third switch is coupled to a second terminal of the first switch, and a control terminal of the third switch is coupled to a first search bit line; and
- a fourth switch, wherein a first terminal of the fourth switch is coupled to a second terminal of the second switch, and a control terminal of the fourth switch is coupled to a second search bit line,
wherein if a control terminal of the first switch receives a first data value of the data and a control terminal of the second switch receives a second data value of the data, a second terminal of the third switch and a second terminal of the fourth switch receive the state bit, or
if the control terminal of the first switch and the control terminal of the second switch receive the state bit, the second terminal of the third switch receives the second data value, and the second terminal of the fourth switch receive the first data value.

13. The content addressable memory cell of claim 12, wherein when the state bit is a predetermined logic value, a level of the match line is kept unchanged.

14. The content addressable memory cell of claim 12, wherein when the state bit is a predetermined logic value, the content addressable memory cell operates in a don't care state.

15. The content addressable memory cell of claim 12, wherein the first storage circuit comprises a latch circuit, and the first data value and the second data value are a plurality of outputs of the latch circuit.

16. The content addressable memory cell of claim 12, wherein the first data value and the second data value have opposite logic values.

17. The content addressable memory cell of claim 12, wherein the second storage circuit comprises a latch circuit, and the state bit is an output of the latch circuit.

\* \* \* \* \*

UNITED STATES PATENT AND TRADEMARK OFFICE
CERTIFICATE OF CORRECTION

| | | |
|---|---|---|
| PATENT NO. | : 12,009,030 B2 | Page 1 of 1 |
| APPLICATION NO. | : 17/865720 | |
| DATED | : June 11, 2024 | |
| INVENTOR(S) | : I-Hao Chiang | |

It is certified that error appears in the above-identified patent and that said Letters Patent is hereby corrected as shown below:

On the Title Page

Insert item (30), Foreign Application Priority Data should be listed as the following:
--(30) Foreign Application Priority Data
October 29, 2021 (TW)......................................... 110140412--

Signed and Sealed this
Thirtieth Day of July, 2024

Katherine Kelly Vidal
*Director of the United States Patent and Trademark Office*